(12) United States Patent
Chainer et al.

(10) Patent No.: US 10,136,554 B2
(45) Date of Patent: *Nov. 20, 2018

(54) PASSIVE TWO-PHASE COOLING WITH FORCED COOLING ASSIST

(71) Applicant: International Business Machines Corporation, Armonk, NY (US)

(72) Inventors: Timothy Joseph Chainer, Putnam Valley, NY (US); Pritish Ranjan Parida, Fishkill, NY (US); Mark Delorman Schultz, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/475,700

(22) Filed: Mar. 31, 2017

(65) Prior Publication Data
US 2018/0288903 A1    Oct. 4, 2018

(51) Int. Cl.
| | | |
|---|---|---|
| *H05K 7/20* | (2006.01) | |
| *H01L 23/473* | (2006.01) | |
| *H01L 23/427* | (2006.01) | |
| *G05D 7/06* | (2006.01) | |
| *G05D 23/19* | (2006.01) | |
| *F04D 19/00* | (2006.01) | |
| *H01L 23/467* | (2006.01) | |

(52) U.S. Cl.
CPC ....... *H05K 7/20381* (2013.01); *F04D 19/002* (2013.01); *G05D 7/0617* (2013.01); *G05D 23/1917* (2013.01); *H05K 7/2029* (2013.01); *H05K 7/20172* (2013.01); *H05K 7/20327* (2013.01); *H05K 7/20727* (2013.01); *H05K 7/20809* (2013.01); *H05K 7/20836* (2013.01)

(58) Field of Classification Search
CPC ........... H05K 7/20209; H05K 7/20281; H05K 7/20381; H05K 7/207; H05K 7/20836; G06F 1/206; G06F 1/32–1/3296
See application file for complete search history.

(56) References Cited

U.S. PATENT DOCUMENTS 4,865,123 A * 9/1989 Kawashima ....... H05K 7/20272
                                                              165/101
5,816,313 A   10/1998 Baker
(Continued)

OTHER PUBLICATIONS

Office Action dated Apr. 19, 2018 for U.S. Appl. No. 15/841,994, 31 pages.

(Continued)

*Primary Examiner* — Robert J Hoffberg
(74) *Attorney, Agent, or Firm* — Amin, Turocy & Watson, LLP

(57) ABSTRACT

Techniques that facilitate two-phase liquid cooling electronics are provided. In one example, a system comprises a pump and a valve. The pump circulates a coolant refrigerant through a two-phase refrigerant system associated with an electronic component. The valve controls a flow path of the coolant refrigerant that flows through the two-phase refrigerant system. Furthermore, the valve modifies the flow path of the coolant refrigerant through the two-phase refrigerant system in response to a determination that an operation of the pump satisfies a defined criterion.

11 Claims, 11 Drawing Sheets

(56) References Cited

U.S. PATENT DOCUMENTS

| | | | |
|---|---|---|---|
| 6,519,955 B2 | 2/2003 | Marsala | |
| 6,532,151 B2* | 3/2003 | Osecky | G06F 1/206 |
| | | | 165/225 |
| 6,679,081 B2 | 1/2004 | Marsala | |
| 6,792,550 B2* | 9/2004 | Osecky | G06F 1/206 |
| | | | 713/300 |
| 6,990,816 B1 | 1/2006 | Zuo et al. | |
| 7,024,573 B2* | 4/2006 | Patel | G06F 1/20 |
| | | | 713/324 |
| 7,149,084 B2* | 12/2006 | Matsushima | G06F 1/20 |
| | | | 361/699 |
| 7,178,049 B2* | 2/2007 | Lutter | G01S 19/37 |
| | | | 714/1 |
| 7,349,213 B2* | 3/2008 | Campbell | H05K 7/2079 |
| | | | 165/104.33 |
| 7,486,513 B2 | 2/2009 | Hall et al. | |
| 7,609,519 B2* | 10/2009 | Campbell | H05K 7/2079 |
| | | | 165/104.33 |
| 7,866,173 B2 | 1/2011 | Brunschwiler et al. | |
| 7,905,106 B2* | 3/2011 | Attlesey | G06F 1/20 |
| | | | 165/104.33 |
| 7,911,793 B2* | 3/2011 | Attlesey | G06F 1/20 |
| | | | 165/104.33 |
| 8,089,764 B2* | 1/2012 | Attlesey | G06F 1/20 |
| | | | 165/104.33 |
| 8,170,724 B2* | 5/2012 | Kelley | H05K 7/2079 |
| | | | 340/501 |
| 8,194,406 B2 | 6/2012 | Campbell et al. | |
| 8,208,258 B2* | 6/2012 | Campbell | H05K 7/2079 |
| | | | 165/104.33 |
| 8,351,200 B2 | 1/2013 | Arimilli et al. | |
| 8,422,218 B2* | 4/2013 | Fried | F28D 15/0266 |
| | | | 361/679.47 |
| 8,430,156 B2* | 4/2013 | Malone | F04B 19/006 |
| | | | 165/104.33 |
| 8,467,189 B2* | 6/2013 | Attlesey | G06F 1/20 |
| | | | 165/80.4 |
| 8,583,290 B2* | 11/2013 | Campbell | G05D 23/1934 |
| | | | 700/282 |
| 8,654,529 B2* | 2/2014 | Attlesey | G06F 1/20 |
| | | | 165/80.3 |
| 8,787,015 B2 | 7/2014 | El-Essawy et al. | |
| 8,899,060 B2 | 12/2014 | Hall et al. | |
| 9,086,859 B2* | 7/2015 | Attlesey | G06F 1/20 |
| 9,128,681 B2* | 9/2015 | Attlesey | G06F 1/20 |
| 9,176,547 B2* | 11/2015 | Attlesey | G06F 1/20 |
| 9,223,360 B2* | 12/2015 | Attlesey | G06F 1/20 |
| 9,363,930 B2 | 6/2016 | Kulkarni et al. | |
| 9,420,729 B2* | 8/2016 | Kelley | H05K 7/2079 |
| 9,832,913 B2* | 11/2017 | Shedd | F25B 41/00 |
| 2012/0194996 A1 | 8/2012 | El-Essawy et al. | |
| 2013/0255925 A1 | 10/2013 | Koontz et al. | |
| 2015/0189796 A1* | 7/2015 | Shedd | F25B 41/00 |
| | | | 361/699 |
| 2016/0281704 A1* | 9/2016 | Lyon | G01M 3/165 |
| 2016/0330875 A1* | 11/2016 | Kelley | H05K 7/2079 |
| 2017/0068258 A1* | 3/2017 | Lyon | G05D 7/0635 |
| 2017/0234623 A1* | 8/2017 | Fried | F28D 15/0266 |
| | | | 165/104.26 |

OTHER PUBLICATIONS

Notice of Allowance received for U.S. Appl. No. 15/841,994 dated Jul. 23, 2018, 21 pages.

* cited by examiner

PASSIVE TWO-PHASE COOLING WITH FORCED COOLING ASSIST

STATEMENT REGARDING FEDERALLY SPONSORED RESEARCH OR DEVELOPMENT

This invention was made with Government support under Contract No.: FA8650-14-C-7466 awarded by Defense Advanced Research Projects Agency (DARPA). The Government has certain rights to this invention.

BACKGROUND

The subject disclosure relates to liquid cooling systems, and more specifically, to two-phase cooling systems for electronics.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, methods, apparatuses and/or devices that facilitate two-phase cooling for electronics are described.

According to an embodiment, a system can comprise a pump and a valve. The pump can circulate a coolant refrigerant through a two-phase refrigerant system associated with an electronic component. The valve can control a flow path of the coolant refrigerant that flows through the two-phase refrigerant system. The valve can also modify the flow path of the coolant refrigerant through the two-phase refrigerant system in response to a determination that an operation of the pump satisfies a defined criterion.

According to another embodiment, a computer-implemented method is provided. The computer-implemented method can comprise monitoring, by a system operatively coupled to a processor, one or more sensors associated with a pump that circulates a coolant refrigerant through a two-phase refrigerant system associated with an electronic component. The computer-implemented method can also comprise modifying, by the system, a flow path of the coolant refrigerant through the two-phase refrigerant system based on a determination that the pump satisfies a defined criterion.

According to yet another embodiment, a system can comprise an enclosure and a controller. The enclosure can comprise a two-phase cooling system and one or more sensors. The two-phase cooling system can comprise an electronic component and a pump that circulates a coolant refrigerant through the two-phase cooling system. The one or more sensors can monitor the pump associated with two-phase cooling system. The controller can be coupled to the one or more sensors and can regulate one or more control valves associated with the pump based on data provided by the one or more sensors.

DETAILED DESCRIPTION

Figure 1:
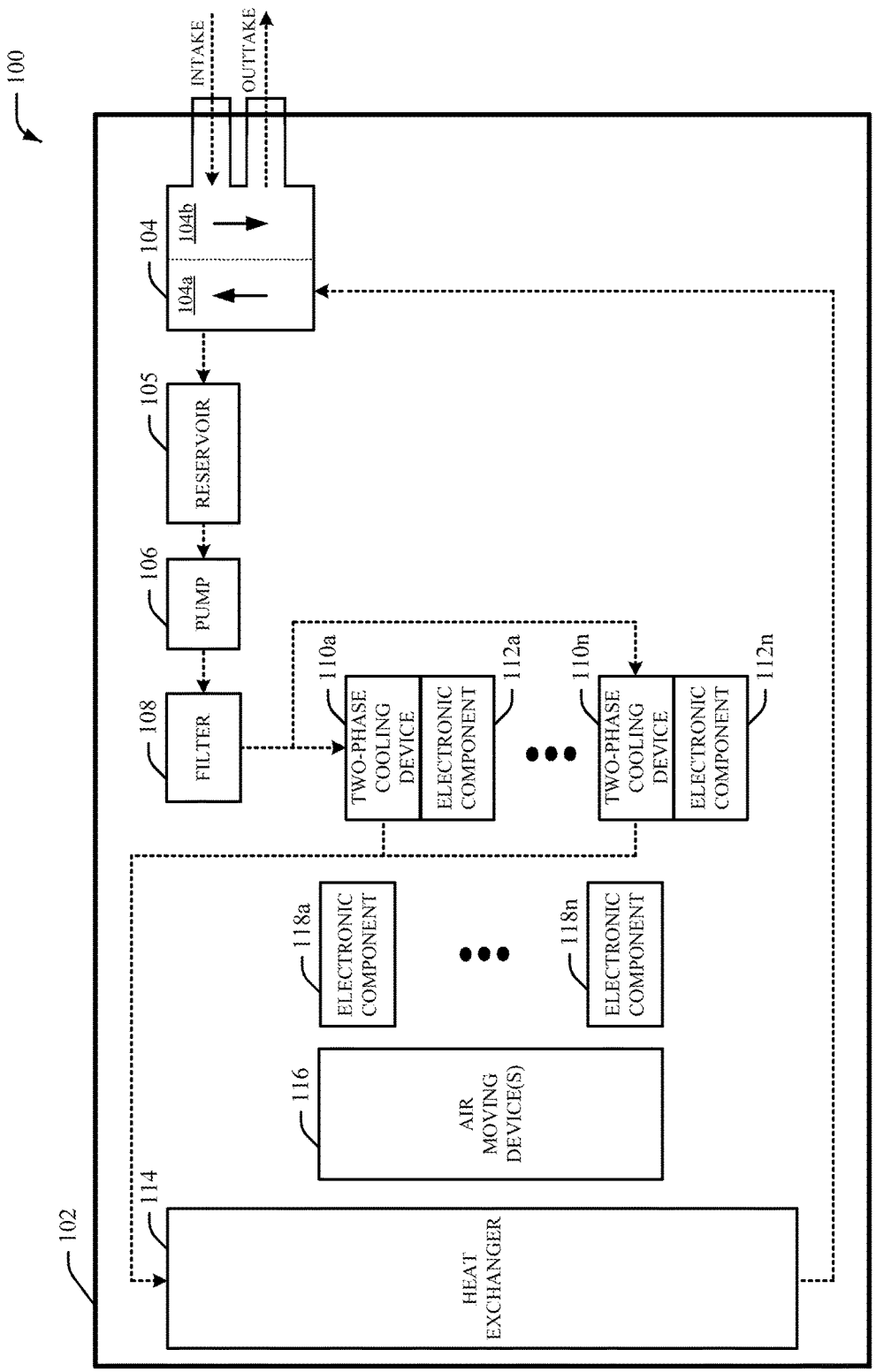
FIG. 1 illustrates a block diagram of an example, non-limiting system associated with two-phase liquid cooling in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

In electronic systems, it is generally important to maintain a temperature of electronic components within a certain temperature range. Often times, one or more fans are employed to reduce a temperature of the electronic components. For example, a server enclosure with one or more electronic components can be air-cooled with one or more fans to provide air flow inside the server enclosure. However, cooling electronic components in a server enclosure with one or more fans is generally inefficient. Furthermore, power usage of one or more fans in a server enclosure can increase when an external temperature surrounding the server enclosure increases. Moreover, power usage of one or more fans in a server enclosure is generally a large percentage of total power employed by a server system associated with a server enclosure.

Embodiments described herein include systems, methods, apparatuses and devices that facilitate two-phase liquid cooling for electronic components. For example, passive cooling of one or more electronic components in a two-phase cooling system can be provided with dynamically determined pumping (e.g., forced pumping) of a pump that pumps coolant refrigerant through the two-phase cooling system. As such, the one or more electronic components can be protected from damage in a scenario where the pump satisfies a defined criterion (e.g., when the pump fails). As used herein, "passive cooling" can refer to providing coolant refrigerant to one or more electronic components and/or one or more two-phase cooling devices without employing a pump. In an aspect, based on a determination that the pump satisfies a defined criterion (e.g., when the pump fails), a passive two-phase cooling mode associated with passive cooling of one or more electronic components can be triggered. In another aspect, a controller can regulate a pump speed of the pump based on monitored sensor data provided by one or more sensors in the two-phase cooling system. Therefore, temperature of the one or more electronic components (e.g., a rate of temperature rise of the one or more electronic components) can be efficiently reduced. In an embodiment, an amount of processing performed by the one or more electronic components can be reduced (e.g., the one or more electronic components can be throttled to a low power state) based on a determination that the pump satisfies a defined criterion (e.g., when the pump fails). In another embodiment, at least a portion of data associated with the one or more electronic components can be transferred to one or more other electronic components (e.g., workload associated with the one or more electronic components can be migrated to one or more other electronic components) based on a determination that the pump satisfies a defined criterion (e.g., when the pump fails). As such, thermal management of one or more electronic components in a two-phase cooling system can be improved, performance (e.g., processing performance) of one or more electronic components in a two-phase cooling system can be improved, and/or damage to one or more electronic components in a two-phase cooling system can be avoided. For example, temperature of one or more electronic components in a two-phase cooling system can be efficiently reduced and/or a temperature of one or more electronic components in a two-phase cooling system can be efficiently maintained within a certain range of temperatures. Furthermore, efficiency of a two-phase cooling system that includes one or more electronic components can be improved.

FIG. 1 illustrates a block diagram of an example, non-limiting system 100 that facilitates two-phase liquid cooling in accordance with one or more embodiments described herein. The system 100 can be, for example, a server system. In various embodiments, the system 100 can employ a two-phase liquid cooling system and an air moving system within an enclosure (e.g., a server enclosure, an electronic component enclosure, etc.) that contains electronic components. The system 100 can employ a two-phase liquid cooling system and an air moving system that is highly technical in nature. Further, the system 100 can be employed to solve new problems that arise through advancements in technology, two-phase cooling systems and/or computer architecture, and the like. One or more embodiments of the system 100 can provide technical improvements to an electronic component and/or a two-phase cooling system by at least providing energy efficient cooling of one or more electronic components, improving computational efficiency of one or more electronic components, improving processing performance of one or more electronic components, reducing total power of a computer system associated with one or more electronic components, improving thermal management of one or more electronic components, reducing a temperature of one or more electronic components, improving flow of coolant fluid through a two-phase cooling system, decreasing an amount of pressure drop associated with a two-phase cooling system, and/or improving energy efficiency of a two-phase cooling system. Additionally or alternatively, one or more embodiments of the system 100 can provide technical improvements to server systems, data center systems, digital distribution systems, data analysis systems, digital systems and/or other systems.

In the embodiment shown in FIG. 1, the system 100 can include an enclosure 102. The enclosure 102 can be, for example, an electronic enclosure (e.g., an electrical enclosure) that contains electronic components. In one example, the enclosure 102 can be a server enclosure. The enclosure 102 can include a two-phase cooling system (e.g., a two-phase refrigerant system) that includes a condenser 104, a reservoir 105, a pump 106, a filter 108, one or more two-phase cooling devices 110a-n, one or more electronic components 112a-n, and/or a heat exchanger 114. The condenser 104 can include an inner refrigerant loop 104a and an external coolant loop 104b. In an embodiment, the condenser 104 can include four ports (e.g., an enclosure-side coolant inlet associated with the inner refrigerant loop 104a, an enclosure-side coolant outlet associated with the inner refrigerant loop 104a, a facility-side coolant intake associated with the external coolant loop 104b, and a facility-side coolant outlet associated with the external coolant loop 104b). As used herein, "enclosure-side" can refer to a location within the enclosure 102 and "facility-side" can refer to a location outside the enclosure 102. The condenser 104 can receive an intake (e.g., INTAKE shown in FIG. 1). The intake can be a facility-side coolant such as, for example, cool air or cool liquid received from an external source to facilitate heat exchange across the condenser 104. The external coolant loop 104b of the condenser 104 can provide supply and return of the facility-side coolant. In one example, the condenser 104 can be an air-cooled condenser where the facility-side coolant is air. In another example, the condenser 104 can be a liquid-cooled condenser where the facility-side coolant is liquid. The inner refrigerant loop 104a of the condenser 104 can facilitate providing coolant refrigerant through a coolant refrigerant loop within the enclosure 102. The inner refrigerant loop 104a of the condenser 104 can be implemented without interaction with the external coolant loop 104b of the condenser 104. In an aspect, the condenser 104 can condense the enclosure-side intake associated with the inner refrigerant loop 104a into a liquid. The coolant refrigerant can be a liquid coolant. In some embodiments, the coolant refrigerant can be a liquid dielectric coolant. For example, the coolant refrigerant can be a liquid dielectric coolant such as a refrigerant (e.g., R1234ze, R134a, R245fa, etc.) or another type of liquid dielectric coolant (e.g., ammonia, etc.). In certain embodiments, the condenser 104 can condense, to a liquid phase, a portion of the coolant refrigerant associated with a vapor phase. The condenser 104 can be, for example, an air-cooled condenser. Alternatively, the condenser 104 can be, for example, a liquid-cooled condenser. The coolant refrigerant from the condenser 104 can be transferred to the reservoir 105. For instance, the reservoir 105 can store the coolant refrigerant. The coolant refrigerant stored by the reservoir 105 can be provided to the one or more two-phase cooling devices 110a-n. In an implementation, the coolant refrigerant stored by the reservoir 105 can be provided to the one or more two-phase cooling devices 110a-n via the pump 106. For example, the pump 106 can pump the coolant refrigerant from the reservoir 105 to the one or more two-phase cooling devices 110a-n. In certain embodiments, the filter 108 can be implemented between the pump 106 and the one or more two-phase cooling devices 110a-n to remove debris or residue from the coolant refrigerant provided to the one or more two-phase cooling devices 110a-n. As such, the pump 106 can circulate the coolant refrigerant through a two-phase refrigerant loop associated with the one or more electronic components 112a-n. In a non-limiting embodiment, a height between the reservoir 105 and the pump 106 can be, for example, at least 10 millimeters. For instance, the reservoir 105 can be located at least 10 millimeters higher than the pump 106 and/or the one or more two-phase cooling devices 110a-n.

The one or more two-phase cooling devices 110a-n can be one or more apparatuses employed to facilitate cooling of the one or more electronic components 112a-n. In one example, the one or more two-phase cooling devices 110a-n can be one or more cold plate devices (e.g., one or more two-phase cooling cold plates) employed to facilitate cooling of the one or more electronic components 112a-n. In an embodiment, the one or more two-phase cooling devices 110a-n can be coupled to the one or more electronic components 112a-n. For instance, the one or more two-phase cooling devices 110a-n can be coupleable and/or coupled to the one or more electronic components 112a-n. In another embodiment, the one or more two-phase cooling devices 110a-n can be formed within the one or more electronic components 112a-n. For instance, the one or more two-phase cooling devices 110a-n can be embedded in the one or more electronic components 112a-n to facilitate chip-embedded two-phase cooling. The one or more electronic components 112a-n can be one or more electronic devices. For example, the one or more electronic components 112a-n can be one or more electronic device packages (e.g., one or more electronic chip package). In one example, the one or more electronic components 112a-n can be one or more processors (e.g., one or more central processing units, one or more microprocessors, etc.). In another example, the one or more electronic components 112a-n can be one or more processor cores (e.g., one or more complementary metal oxide semiconductor (CMOS) processor cores). In an embodiment, the one or more two-phase cooling devices 110a-n can be formed via a three-dimensional (3D) printing process. For example, in some embodiments, the one or more electronic components 112a-n can be one or more 3D stacked electronic chips. In one example, one or more layer of the one or more two-phase cooling devices 110a-n can be 3D printed.

As mentioned above, the one or more two-phase cooling devices 110a-n can be employed as a cooling mechanism for the one or more electronic components 112a-n. For instance, the one or more electronic components 112a-n can be a heat source. The one or more electronic components 112a-n can typically generate heat in response to being operated (e.g., being in a powered on state) and/or in response to processing data. The heat generated by the one or more electronic components 112a-n can be generated as a function of properties for the one or more electronic components 112a-n such as, for example, power dissipation properties for the one or more electronic components 112a-n, density of the one or more electronic components 112a-n, geometric dimensions for the one or more electronic components 112a-n, structural properties for the one or more electronic components 112a-n, electrical properties for the one or more electronic components 112a-n, power consumption of the one or more electronic components 112a-n, or the like. Therefore, heat generated by the one or more electronic components 112a-n can be dissipated via the one or more two-phase cooling devices 110a-n. In an aspect, the one or more electronic components 112a-n can be one or more electronic devices that satisfy a defined criterion. A defined criterion can be associated with a property for the one or more electronic components 112a-n as mentioned above. In one example, a defined criterion associated with the one or more electronic components 112a-n can be, for example, a defined power level for the one or more electronic components 112a-n. In another example, a defined criterion associated with the one or more electronic components 112a-n can be, for example, a defined density level for the one or more electronic components 112a-n.

In an embodiment, the coolant refrigerant that is condensed at and exited from the condenser 104 can be received by the one or more two-phase cooling devices 110a-n to facilitate dissipation of heat generated by the one or more electronic components 112a-n. The coolant refrigerant (e.g., the condensed coolant refrigerant) that exits the condenser 104 can flow through the one or more two-phase cooling devices 110a-n. Furthermore, the coolant refrigerant can be employed by the one or more two-phase cooling devices 110a-n to reduce a temperature of the one or more two-phase cooling devices 110a-n and/or to dissipate the heat generated by the one or more two-phase cooling devices 110a-n in various embodiments. The coolant refrigerant provided to the one or more two-phase cooling devices 110a-n can be transformed into a liquid-vapor mixture (e.g., a two-phase mixture) as the liquid coolant flows through the one or more two-phase cooling devices 110a-n. The coolant refrigerant that flows through the one or more two-phase cooling devices 110a-n can also be provided to the heat exchanger 114. The heat exchanger 114 can cool the coolant refrigerant provided to the heat exchanger 114. For instance, the heat exchanger 114 can employ air to cool the coolant refrigerant provided to the heat exchanger 114. The heat exchanger 114 can provide the coolant refrigerant cooled by the air to the condenser 104 to complete the two-phase refrigerant loop. In an embodiment, the heat exchanger 114 can transfer heat from hot air within the enclosure 102 to the coolant refrigerant (e.g., a liquid/vapor mixture) to facilitate cooling of air within the enclosure 102. Air cooled by the heat exchanger 114 can be further circulated within the enclosure 102 via the one or more air moving devices 116 to cool the one or more electronic components 118a-n. As used herein, an "air moving device" can be a device such as a fan and, in certain embodiments, a heat sink attached to an electronic component. In another embodiment, the condenser 104 can condense vapors associated with the coolant refrigerant to a liquid phase. Furthermore, the pump 106 can pump the coolant refrigerant that is condensed by the condenser 104 into the liquid phase back into the one or more electronic components 112a-n via the one or more two-phase cooling devices 110a-n.

In an aspect, the one or more air moving devices 116 can be employed to reduce a temperature of the one or more electronic components 118a-n via air moving. In one example, the one or more air moving devices 116 can be one or more fans that can be employed as a cooling mechanism for the one or more electronic components 118*a*-*n*. In an aspect, the one or more electronic components 118*a*-*n* can be a heat source. The one or more electronic components 118*a*-*n* can typically generate heat in response to being operated (e.g., being in a powered on state) and/or in response to processing data. The heat generated by the one or more electronic components 118*a*-*n* can be generated as a function of properties for the one or more electronic components 118*a*-*n* such as, for example, power dissipation properties for the one or more electronic components 118*a*-*n*, density of the one or more electronic components 118*a*-*n*, geometric dimensions for the one or more electronic components 118*a*-*n*, structural properties for the one or more electronic components 118*a*-*n*, electrical properties for the one or more electronic components 118*a*-*n*, power consumption of the one or more electronic components 118*a*-*n*, or the like. Therefore, heat generated by the one or more electronic components 118*a*-*n* can be dissipated via the one or more air moving devices 116. In an aspect, the one or more electronic components 118*a*-*n* can be one or more electronic devices that satisfy a defined criterion. A defined criterion can be associated with a property for the one or more electronic components 118*a*-*n* as mentioned above. In one example, a defined criterion associated with the one or more electronic components 118*a*-*n* can be, for example, a defined power level for the one or more electronic components 118*a*-*n*. In another example, a defined criterion associated with the one or more electronic components 118*a*-*n* can be, for example, a defined density level for the one or more electronic components 118*a*-*n*. In an embodiment, the one or more electronic components 118*a*-*n* can be, for example, one or more memory devices (e.g., one or more volatile memory devices, one or more non-volatile memory devices, etc.). Additionally or alternatively, the one or more electronic components 118*a*-*n* can be, for example, one or more memory disk drives (e.g., one or more hard disk drives, etc.). Additionally or alternatively, the one or more electronic components 118*a*-*n* can be, for example, one or more power supplies.

In an embodiment, the heat exchanger 114 can include a first section associated with an inlet and an outlet for a first coolant from which heat is removed, and a second section associated with an intake and an outtake for a second coolant which can be employed to extract heat. In certain embodiments, the heat exchanger 114 can be an air-to-liquid heat exchanger. The heat exchanger 114 can be employed to capture heat from air (e.g., a first coolant) associated with the one or more air moving devices 116. The heat exchanger 114 can also provide the heat associated with the one or more air moving devices 116 into the two-phase refrigerant loop associated with the condenser 104. For example, the heat exchanger 114 can transfer heat, from air in the enclosure 102 associated with the one or more air moving devices 116, to the two-phase refrigerant loop associated with the condenser 104. The two-phase refrigerant loop associated with the condenser 104 can be associated with a refrigerant (e.g., a second coolant such as, for example, R1234ze). Intake for the inner refrigerant loop 104*a* of the condenser 104 can be a liquid coolant (e.g., a warm liquid coolant), a liquid/vapor mix, or vapor (e.g., hot vapor). The condenser 104 can condense the liquid coolant received at the intake of the inner refrigerant loop 104*a* into a liquid. In an embodiment, the condenser 104 can provide an outtake (e.g., OUTTAKE shown in FIG. 1). The outtake can be, for example, hot air or hot liquid associated with the external coolant loop 104*b*.

Figure 2:
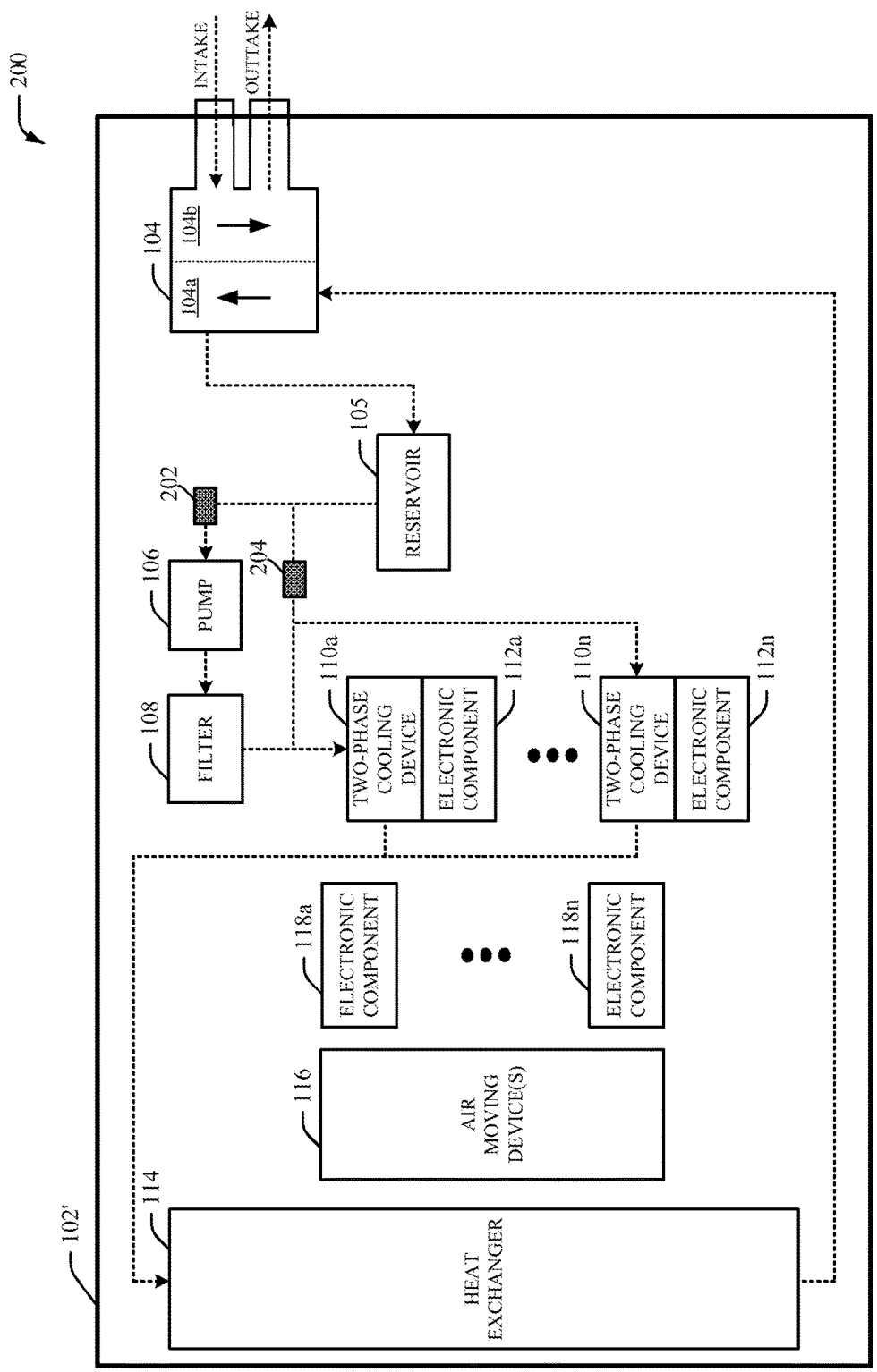
FIG. 2 illustrates a block diagram of another example, non-limiting system associated with two-phase liquid cooling in accordance with one or more embodiments described herein.

FIG. 2 illustrates a block diagram of an example, non-limiting system 200 that facilitates two-phase liquid cooling in accordance with one or more embodiments described herein. Repetitive description of like elements employed in other embodiments described herein is omitted for sake of brevity.

The system 200 includes an enclosure 102'. The enclosure 102' can be an alternate embodiment of the enclosure 102. The enclosure 102' can include the two-phase cooling system that includes the condenser 104, the reservoir 105, the pump 106, the filter 108, the one or more two-phase cooling devices 110*a*-*n*, the one or more electronic components 112*a*-*n*, and/or the heat exchanger 114. Additionally, the enclosure 102' can include a first valve 202 and a second valve 204. In one example, the first valve 202 can be a first control valve and the second valve 204 can be a second control valve. The first valve 202 can be implemented between the reservoir 105 and the pump 106. The second valve 204 can be implemented between the reservoir 105 and the one or more two-phase cooling devices 110*a*-*n*. The first valve 202 and the second valve 204 can be employed to control a flow direction of the coolant refrigerant through the two-phase cooling system. For instance, the first valve 202 and the second valve 204 can be employed to control a flow direction of the coolant refrigerant with respect to the pump 106. In an aspect, the coolant refrigerant can flow through the pump 106 when the first valve 202 is open and the second valve 204 is closed. In another aspect, the coolant refrigerant can flow through one or more two-phase cooling devices 110*a*-*n* without flowing through the pump 106 when the first valve 202 is closed and the second valve 204 is open. In an embodiment, the first valve 202 and/or the second valve 204 can control a flow path of the coolant refrigerant that flows through a two-phase refrigerant system associated with the pump 106. The first valve 202 and/or the second valve 204 can modify the flow path of the coolant refrigerant through the two-phase refrigerant system in response to a determination that an operation of the pump 106 satisfies a defined criterion. In an embodiment, the first valve 202 and/or the second valve 204 can be a passive check-valve. For example, the second valve 204 can close (e.g., close automatically) when pressure from the pump 106 is above a defined pressure threshold (e.g., when an outlet pressure of the pump 106 is higher than a pressure within the reservoir 105). Furthermore, the second valve 204 can open (e.g., open automatically) when pressure from the pump 106 is below a defined pressure threshold (e.g., when an outlet pressure of the pump 106 is lower than a pressure within the reservoir 105). Therefore, in certain embodiments, the enclosure 102' can be implemented without the first valve 202. Therefore, the one or more electronic components 112*a*-*n* can be passively cooled (e.g., the coolant refrigerant can be passively provided to the one or more two-phase cooling devices 110*a*-*n*) during a passive two-phase cooling mode when the coolant refrigerant flows through the second valve 204 without flowing through the first valve 202 and/or the pump 106.

Figure 3:
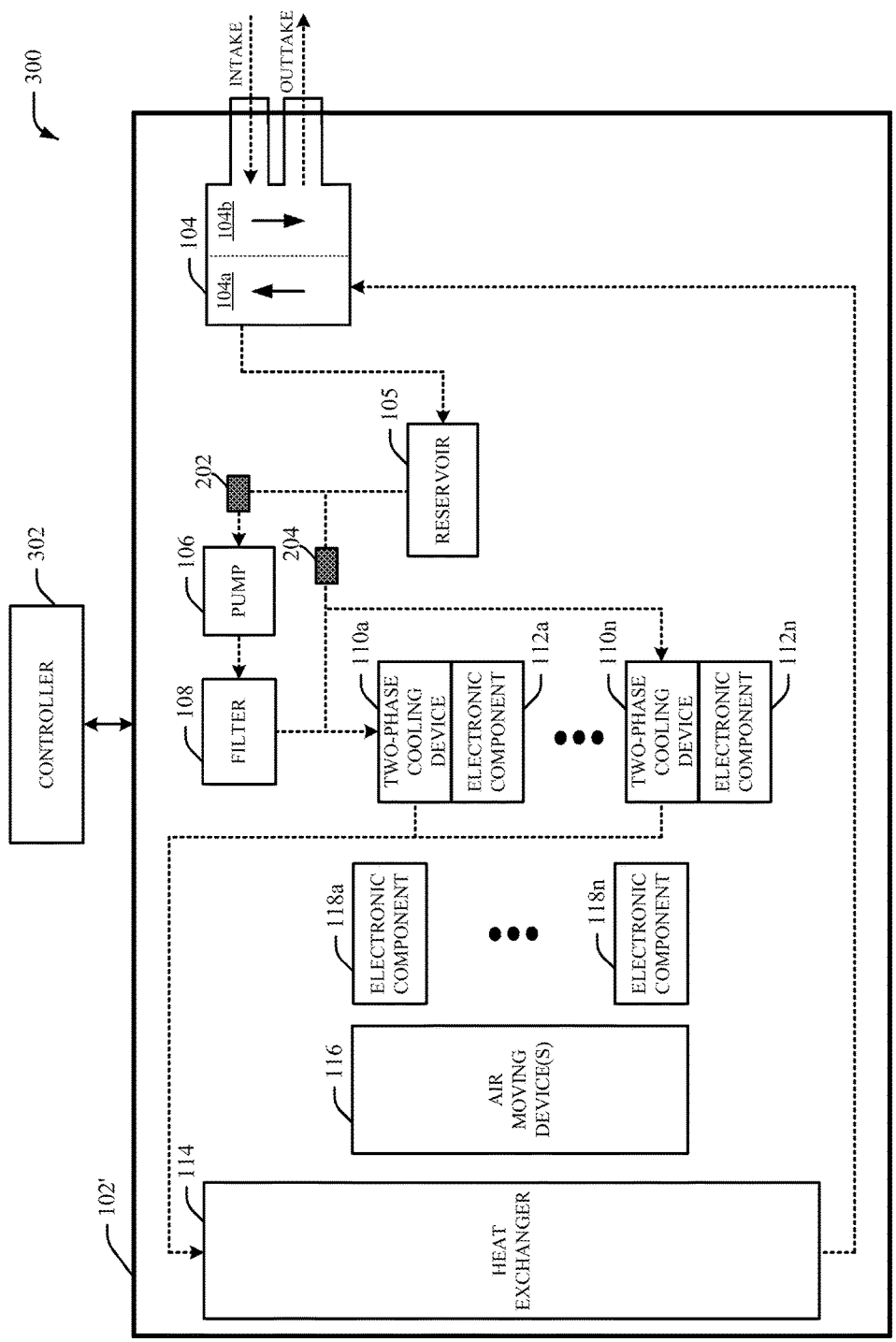
FIG. 3 illustrates a block diagram of yet another example, non-limiting system associated with two-phase liquid cooling in accordance with one or more embodiments described herein.

FIG. 3 illustrates a block diagram of an example, non-limiting system 300 that facilitates two-phase liquid cooling in accordance with one or more embodiments described herein. Repetitive description of like elements employed in other embodiments described herein is omitted for sake of brevity.

The system 300 includes the enclosure 102' and the controller 302. In one embodiment, the controller 302 can be located external from the enclosure 102'. In another embodiment, the controller 302 can be located within the enclosure 102'. The controller 302 can regulate the first valve 202 and the second valve 204 based on data associated with the pump 106. For instance, the controller 302 can regulate the first valve 202 and the second valve 204 to control a flow path of the coolant refrigerant that flows through the two-phase refrigerant system. In an aspect, the controller 302 can modify the flow path of the coolant refrigerant through the two-phase refrigerant system in response to a determination (e.g., a determination based on data associated with the pump 106) that the pump 106 satisfies a defined criterion. In one example, the controller 302 can modify the flow path of the coolant refrigerant through the two-phase refrigerant system in response to a determination (e.g., a determination based on data associated with the pump 106) that the pump 106 is not operational (e.g., that the pump 106 is turned off). Additionally or alternatively, the controller 302 can modify a processing state of the one or more electronic component 112a-n based on a determination (e.g., a determination based on data associated with the pump 106) that the pump 106 is not operational (e.g., that the pump 106 is turned off). For instance, the controller 302 can instruct the one or more electronic component 112a-n to enter a low power mode based on a determination (e.g., a determination based on data associated with the pump 106) that the pump 106 is not operational (e.g., that the pump 106 is turned off). The low power mode can include, for example, performing a reduced an amount of processing by the one or more electronic component 112a-n and/or modifying a processing frequency of the one or more electronic component 112a-n. Additionally or alternatively, the controller 302 can transfer at least a portion of data associated with an electronic component from the one or more electronic component 112a-n to another electronic component based on a determination (e.g., a determination based on data associated with the pump 106) that the pump 106 is not operational (e.g., that the pump 106 is turned off). In a non-limiting example, the controller 302 can transfer at least a portion of data associated with the electronic component 112a to the electronic component 112n based on a determination (e.g., a determination based on data associated with the pump 106) that the pump 106 is not operational (e.g., that the pump 106 is turned off). In another non-limiting example, the controller 302 can transfer at least a portion of data associated with the electronic component 112a to an electronic component located externally from the enclosure 102' based on a determination (e.g., a determination based on data associated with the pump 106) that the pump 106 is not operational (e.g., that the pump 106 is turned off).

In certain embodiments, the controller 302 can additionally or alternatively transmit one or more notifications to an electronic device in communication with the controller 302 based on a determination (e.g., a determination based on data associated with the pump 106) that the pump 106 is not operational (e.g., that the pump 106 is turned off). For instance, the electronic device can be a device that comprises a display such as, for example, a computing device, a computer, a desktop computer, a laptop computer, a monitor device, a smart device, a smart phone, a mobile device, a handheld device, a tablet, a wearable device, a portable computing device or another type of device associated with a display. In an embodiment, the controller 302 can be in communication with the electronic device via one or more networks than can include, for example, one or more wireless networks and/or one or more wired networks, including but not limited to, a wide area network (WAN, e.g., the Internet), a local area network (LAN) and/or a cellular network. The one or more networks can also include one or more network devices (e.g., network hardware, network equipment, computer networking devices, etc.) to facilitate communication and/or interaction between at least the controller 302 and the electronic device.

In certain embodiments, aspects of the controller 302 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the controller 302 can also include a memory that stores computer executable components and instructions. Furthermore, the controller 302 can include a processor to facilitate execution of the instructions (e.g., computer executable components and corresponding instructions) by the controller 302.

Figure 4:
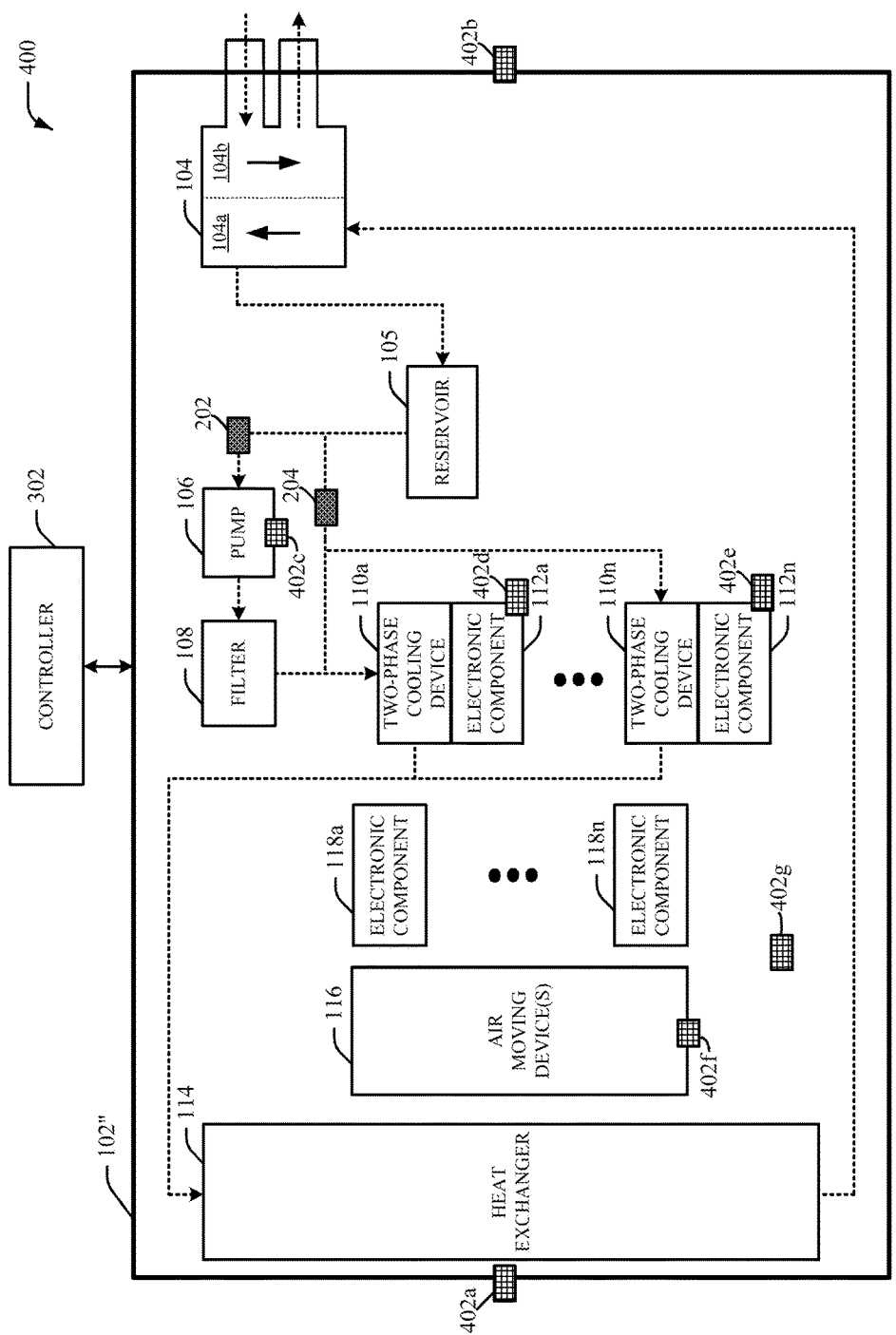
FIG. 4 illustrates a block diagram of yet another example, non-limiting system associated with two-phase liquid cooling in accordance with one or more embodiments described herein.

FIG. 4 illustrates a block diagram of an example, non-limiting system 400 that facilitates two-phase liquid cooling in accordance with one or more embodiments described herein. Repetitive description of like elements employed in other embodiments described herein is omitted for sake of brevity.

The system 400 includes an enclosure 102" and the controller 302. The enclosure 102" can be an alternate embodiment of the enclosure 102 and/or the enclosure 102'. The enclosure 102" can include the two-phase cooling system that includes the condenser 104, the reservoir 105, the pump 106, the filter 108, the one or more two-phase cooling devices 110a-n, the one or more electronic components 112a-n, and/or the heat exchanger 114. The enclosure 102" can also include the first valve 202 and the second valve 204. Additionally, the enclosure 102" can include a sensor 402a, a sensor 402b, a sensor 402c, a sensor 402d, a sensor 402e, a sensor 402f, a sensor 402g.

In an embodiment, the controller 302 can regulate the first valve 202 and the second valve 204 based on data provided by the sensor 402a, the sensor 402b, the sensor 402c, the sensor 402d, the sensor 402e, the sensor 402f, and/or the sensor 402g. The sensor 402a, the sensor 402b, the sensor 402c, the sensor 402d, the sensor 402e, the sensor 402f, and/or the sensor 402g can be employed to monitor temperature, pressure, power, flow rate and/or other measurements associated with the two-phase cooling system and/or the enclosure 102". For example, the sensor 402a can be a temperature sensor associated with air intake for the heat exchanger 114, the sensor 402b can be a temperature sensor associated with air outtake associated with the enclosure 102", the sensor 402c can be a temperature sensor, a pressure sensor, a power usage sensor and/or a flow rate sensor associated with the pump 106, the sensor 402d can be a temperature sensor and/or a power usage sensor associated with the electronic component 112a, the sensor 402e can be a temperature sensor, a power usage sensor and/or a flow rate sensor associated with the one or more air moving devices 116, and the sensor 402g can be a temperature sensor associated with air within the enclosure 102 (e.g., air associated with the one or more air moving devices 116). It is to be appreciated that sensor 402a, the sensor 402b, the sensor 402c, the sensor 402d, the sensor 402e, the sensor 402f, and/or the sensor 402g can be located in a different location within the enclosure 102. Furthermore, it is to be appreciated that the enclosure 102 can include a different number of sensors. Moreover, it is to be appreciated that the sensor 402a, the sensor 402b, the sensor 402c, the sensor 402d, the sensor 402e, the sensor 402f, and/or the sensor 402g can include one or more sensors.

In an aspect, the controller 302 can regulate the first valve 202 and the second valve 204 based on data provided by the sensor 402a, the sensor 402b, the sensor 402c, the sensor 402d, the sensor 402e, the sensor 402f, and/or the sensor 402g. For instance, the controller 302 can regulate the first valve 202 and the second valve 204 based on temperature data, pressure data, power data, flow rate data and/or other measurement data provided by the sensor 402a, the sensor 402b, the sensor 402c, the sensor 402d, the sensor 402e, the sensor 402f, and/or the sensor 402g. In one example, the controller 302 can regulate the first valve 202 and the second valve 204 to alter flow rate of the coolant refrigerant associated with the two-phase refrigerant loop (e.g., alter a flow rate through the pump 106) based on temperature data, pressure data, power data, flow rate data and/or other measurement data provided by the sensor 402a, the sensor 402b, the sensor 402c, the sensor 402d, the sensor 402e, the sensor 402f, and/or the sensor 402g.

Figure 5:
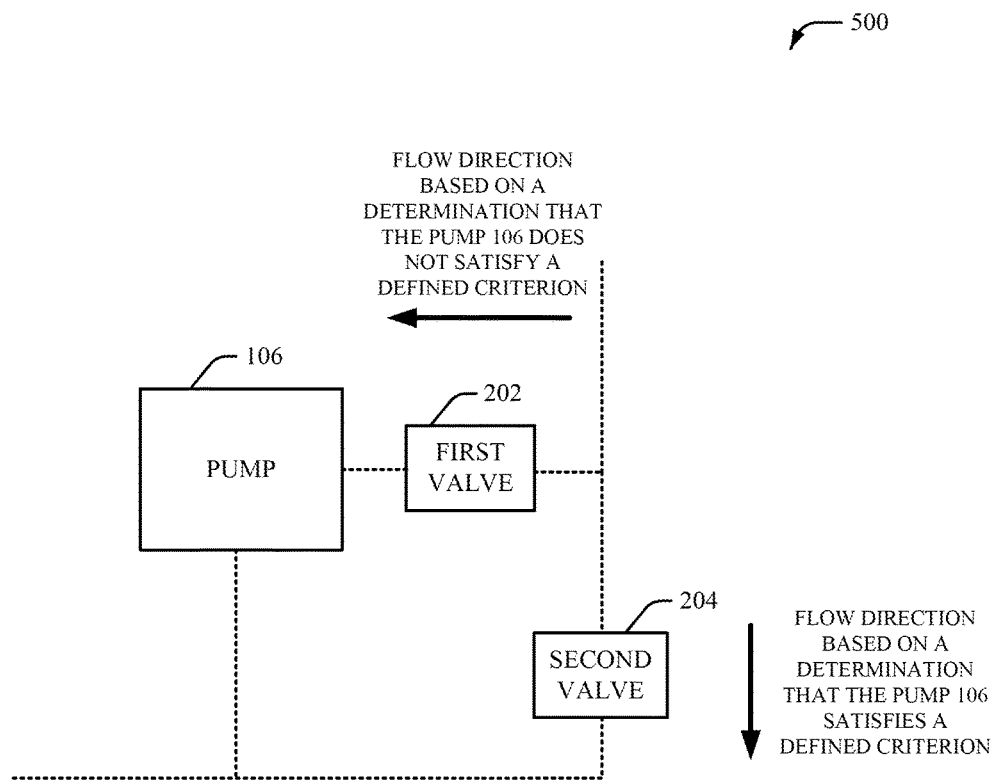
FIG. 5 illustrates a block diagram of an example, non-limiting system associated with flow of a coolant refrigerant in accordance with one or more embodiments described herein.

FIG. 5 illustrates a block diagram of an example, non-limiting system 500 that facilitates control of a flow path of coolant refrigerant in accordance with one or more embodiments described herein. Repetitive description of like elements employed in other embodiments described herein is omitted for sake of brevity.

The system 500 can represent a portion of a two-phase cooling system associated with the enclosure 102, the enclosure 102' and/or the enclosure 102". For instance, the system 500 can include the pump 106, the first valve 202 and the second valve 204. In an aspect, the controller 302 can control the first valve 202 and the second valve 204 to modify a flow path of the coolant refrigerant through the two-phase cooling system. For example, the controller 302 can open the first valve 202 or the controller can close the first valve 202. Furthermore, the controller 302 can open the second valve 204 or the controller can close the second valve 204. In an embodiment, the controller 302 can control the first valve 202 and the second valve 204 based on a determination as to whether the pump 106 satisfies a defined criterion. For example, the controller 302 can control the first valve 202 and the second valve 204 based on a determination as to whether the pump 106 is not operational (e.g., the pump 106 is off). In an aspect, the controller 302 can open the first valve 202 and close the second valve 204 based on a determination that the pump 106 does not satisfy a defined criterion (e.g., based on a determination that the pump is operational and/or powered on). In another aspect, the controller 302 can close the first valve 202 and open the second valve 204 based on a determination that the pump 106 satisfies a defined criterion (e.g., based on a determination that the pump is not operational and/or powered off). A two-phase cooling system can be associated with passive cooling of the one or more electronic components 112a-n when the first valve 202 is closed and the second valve 204 is open. Therefore, a flow direction of the coolant refrigerant can be through the first valve 202 based on a determination that the pump 106 does not satisfy a defined criterion, and a flow direction of the of the coolant refrigerant can be through the second valve 204 based on a determination that the pump 106 satisfies the defined criterion. In one example, the controller 302 can determine opening and closing of the first valve 202 and/or the second valve 204 based on a flow direction of the coolant refrigerant that flows through the two-phase refrigerant system (e.g., based on a flow path of the coolant refrigerant that flows through the two-phase refrigerant system). Additionally or alternatively, the controller 302 can determine opening and closing of the first valve 202 and/or the second valve 204 based on a pressure across the first valve 202 and/or the second valve 204. For instance, the a pressure across the first valve 202 and/or the second valve 204 can be a differential pressure between an entrance point and an exit point for the coolant refrigerant through the first valve 202 and/or the second valve 204 along a flow direction of the coolant refrigerant. Accordingly, the controller 302 can control a flow path of the coolant refrigerant that flows through the two-phase refrigerant system associated with the pump 106, the first valve 202 and the second valve 204.

Figure 6:
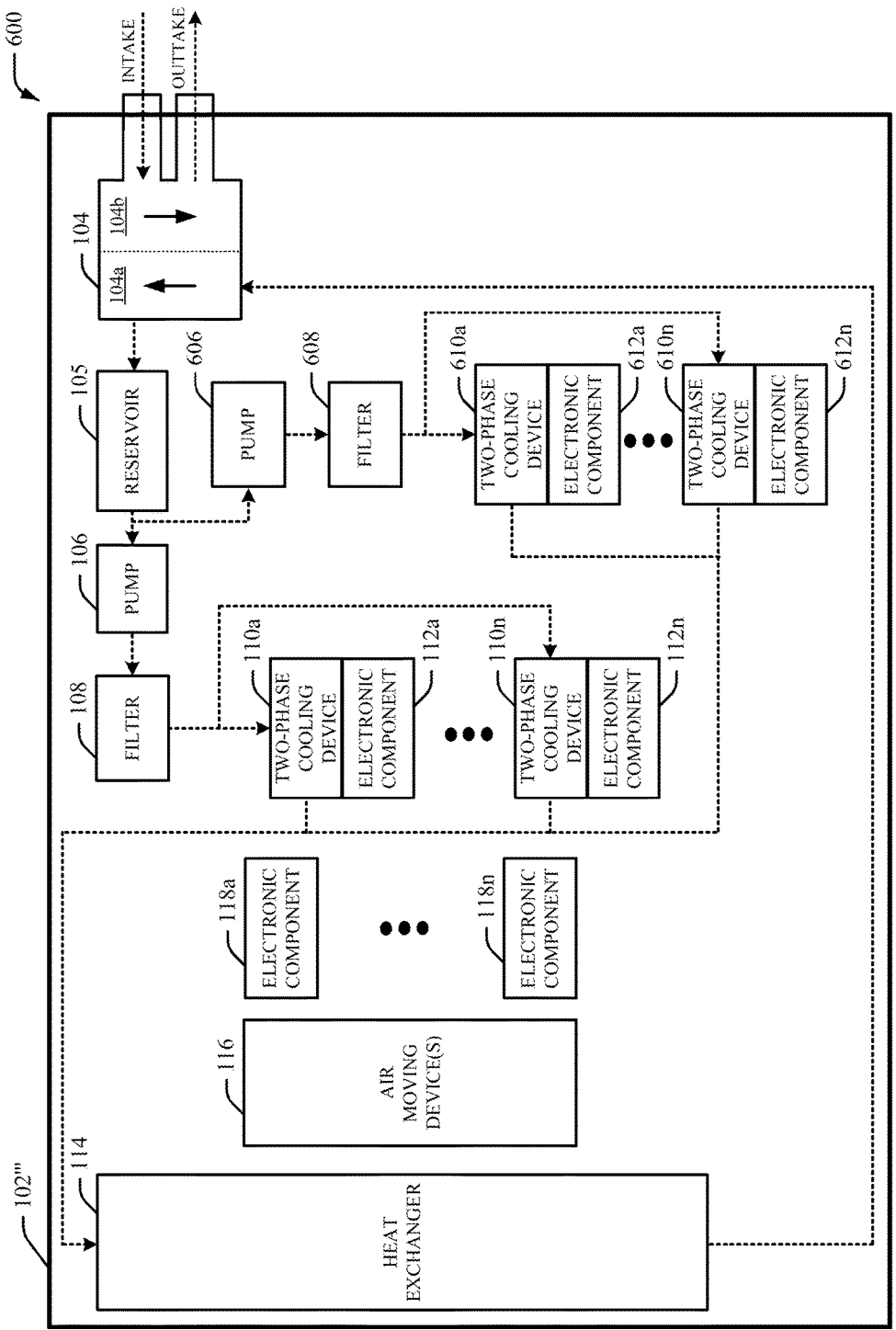
FIG. 6 illustrates a block diagram of yet another example, non-limiting system associated with two-phase liquid cooling in accordance with one or more embodiments described herein.

FIG. 6 illustrates a block diagram of an example, non-limiting system 600 that facilitates two-phase liquid cooling in accordance with one or more embodiments described herein. Repetitive description of like elements employed in other embodiments described herein is omitted for sake of brevity.

The system 600 includes an enclosure 102'''. The enclosure 102''' can be an alternate embodiment of the enclosure 102, the enclosure 102' and/or the enclosure 102". In one example, the enclosure 102''' can be a server rack-level implementation of an enclosure. The enclosure 102''' can include the two-phase cooling system that includes the condenser 104, the reservoir 105, the pump 106, the filter 108, the one or more two-phase cooling devices 110a-n, the one or more electronic components 112a-n, the heat exchanger 114, a pump 606, a filter 608, one or more two-phase cooling devices 610a-n, and/or one or more electronic components 612a-n. In an embodiment, the coolant refrigerant stored by the reservoir 105 can be provided to the one or more two-phase cooling devices 110a-n via the pump 106. For example, the pump 106 can pump the coolant refrigerant from the reservoir 105 to the one or more two-phase cooling devices 110a-n. Additionally, the coolant refrigerant stored by the reservoir 105 can be provided to the one or more two-phase cooling devices 610a-n via the pump 606. For example, the pump 106 can pump a portion of the coolant refrigerant from the reservoir 105 to the one or more two-phase cooling devices 110a-n. Furthermore, the pump 606 can pump another portion of the coolant refrigerant from the reservoir 105 to the one or more two-phase cooling devices 610a-n. In certain embodiments, the filter 608 can be implemented between the pump 606 and the one or more two-phase cooling devices 610a-n to remove debris or residue from the coolant refrigerant provided to the one or more two-phase cooling devices 610a-n. As such, the pump 106 can circulate the coolant refrigerant through a portion of a two-phase refrigerant loop (e.g., a portion of the two-phase refrigerant loop associated with the one or more electronic components 112a-n) and the pump 606 can circulate the coolant refrigerant through another portion of the two-phase refrigerant loop (e.g., another portion of the two-phase refrigerant loop associated with the one or more electronic components 612a-n).

The one or more two-phase cooling devices 610a-n can be one or more apparatuses employed to facilitate cooling of the one or more electronic components 612a-n. In one example, the one or more two-phase cooling devices 610a-n can be one or more cold plate devices (e.g., one or more two-phase cooling cold plates) employed to facilitate cooling of the one or more electronic components 612a-n. In an embodiment, the one or more two-phase cooling devices 610a-n can be coupled to the one or more electronic components 612a-n. For instance, the one or more two-phase cooling devices 610a-n can be coupleable and/or coupled to the one or more electronic components 612a-n. In another embodiment, the one or more two-phase cooling devices 610a-n can be formed within the one or more electronic components 612a-n. For instance, the one or more two-phase cooling devices 610a-n can be embedded in the one or more electronic components 612a-n to facilitate chip-embedded two-phase cooling. The one or more electronic components 612a-n can be one or more electronic devices. For example, the one or more electronic components 612a-n can be one or more electronic device packages (e.g., one or more electronic chip package). In one example, the one or more electronic components 612a-n can be one or more processors (e.g., one or more central processing units, one or more microprocessors, etc.). In another example, the one or more electronic components 612a-n can be one or more processor cores (e.g., one or more complementary metal oxide semiconductor (CMOS) processor cores). In an embodiment, the one or more two-phase cooling devices 610a-n can be formed via a 3D printing process. For example, in some embodiments, the one or more electronic components 612a-n can be one or more 3D stacked electronic chips. In one example, one or more layer of the one or more two-phase cooling devices 610a-n can be 3D printed.

As mentioned above, the one or more two-phase cooling devices 610a-n can be employed as a cooling mechanism for the one or more electronic components 612a-n. For instance, the one or more electronic components 612a-n can be a heat source. The one or more electronic components 612a-n can typically generate heat in response to being operated (e.g., being in a powered on state) and/or in response to processing data. The heat generated by the one or more electronic components 612a-n can be generated as a function of properties for the one or more electronic components 612a-n such as, for example, power dissipation properties for the one or more electronic components 612a-n, density of the one or more electronic components 612a-n, geometric dimensions for the one or more electronic components 612a-n, structural properties for the one or more electronic components 612a-n, electrical properties for the one or more electronic components 612a-n, power consumption of the one or more electronic components 612a-n, or the like. Therefore, heat generated by the one or more electronic components 612a-n can be dissipated via the one or more two-phase cooling devices 610a-n. In an aspect, the one or more electronic components 612a-n can be one or more electronic devices that satisfy a defined criterion. A defined criterion can be associated with a property for the one or more electronic components 612a-n as mentioned above. In one example, a defined criterion associated with the one or more electronic components 612a-n can be, for example, a defined power level for the one or more electronic components 612a-n. In another example, a defined criterion associated with the one or more electronic components 612a-n can be, for example, a defined density level for the one or more electronic components 612a-n.

In an embodiment, the coolant refrigerant provided by the condenser 104 can be received by the one or more two-phase cooling devices 610a-n to facilitate dissipation of heat generated by the one or more electronic components 612a-n. The coolant refrigerant provided by the condenser 104 can flow through the one or more two-phase cooling devices 610a-n. Furthermore, the coolant refrigerant can be employed by the one or more two-phase cooling devices 610a-n to reduce a temperature of the one or more two-phase cooling devices 610a-n and/or to offset the heat generated by the one or more two-phase cooling devices 610a-n in various embodiments. The coolant refrigerant provided to the one or more two-phase cooling devices 610a-n can be transformed into a liquid-vapor mixture (e.g., a two-phase mixture) as the liquid coolant flows through the one or more two-phase cooling devices 610a-n. The coolant refrigerant that flows through the one or more two-phase cooling devices 610a-n can also be provided to the heat exchanger 114.

Figure 7:
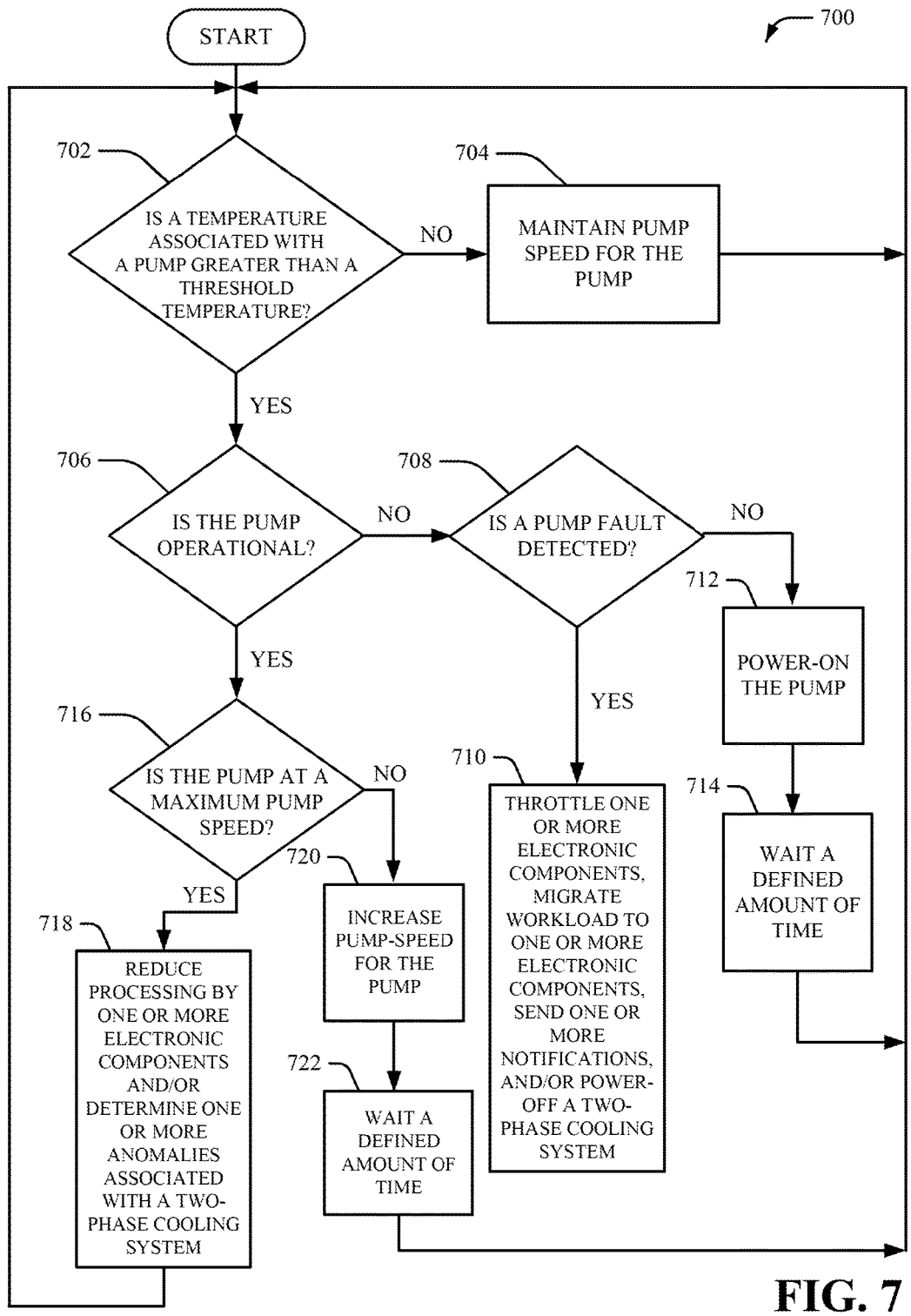
FIG. 7 illustrates a flow diagram of an example, non-limiting method that facilitates control of a pump within an enclosure in accordance with one or more embodiments described herein.

FIG. 7 illustrates a flow diagram of an example, non-limiting method 700 that facilitates control of a pump within an enclosure in accordance with one or more embodiments described herein. In an embodiment, the method 700 can be associated with a controller (e.g., controller 302). Repetitive description of like elements employed in other embodiments described herein is omitted for sake of brevity.

At 702, it is determined whether a temperature associated with a pump (e.g., pump 106) is greater than a threshold temperature. In one example, the temperature can be determined based on a sensor (e.g., sensor 402c) coupled to the pump. If no, method 700 proceeds to 704. At 704, a pump speed for the pump is maintained and method 700 returns to 702. If yes, method proceeds to 706.

At 706, it is determined whether the pump is operational. For example, it can be determined whether the pump is powered on and/or operating according to one or more design specifications. If no, method 700 proceeds to 708. If yes, method proceeds to 716. At 708, it is determined whether a pump fault is detected. If yes, method 700 proceeds to 710. If yes, method proceeds to 712. At 710, one or more electronic components are throttled, a workload is migrated to one or more electronic components, one or more notifications are sent and/or a two-phase cooling system is powered-off. For instance, an amount of processing by one or more electronic components in a two-phase cooling system can be reduced, at least a portion of data associated with one or more electronic components in a two-phase cooling system can be transferred to one or more other electronic components, one or more notifications can be sent to an electronic device that includes a display, and/or one or more components in a two-phase cooling system can be powered-off. At 712, the pump is powered-on. At 714, method 700 waits a defined amount of time before returning to 702.

At 716, it is determined whether the pump is at a maximum pump speed. For example, it can be determined whether a pump-speed for the pump is at a maximum threshold level. If yes, method 700 proceeds to 718. At 718, processing by one or more electronic components is reduced and/or one or more anomalies associated with a two-phase cooling system is determined. For example, an amount of processing performed by one or more electronic components associated with a two-phase cooling system can be reduced. Additionally or alternatively, one or more anomalies associated with the one or more electronic components and/or one or more other components in the two-phase cooling system can be determined. If yes, method 700 proceed to 720. At 720, a pump-speed for the pump is increased. For example, a pump speed for the pump can be increased by a defined amount. At 722, method 700 waits a defined amount of time before returning to 702.

Figure 8:
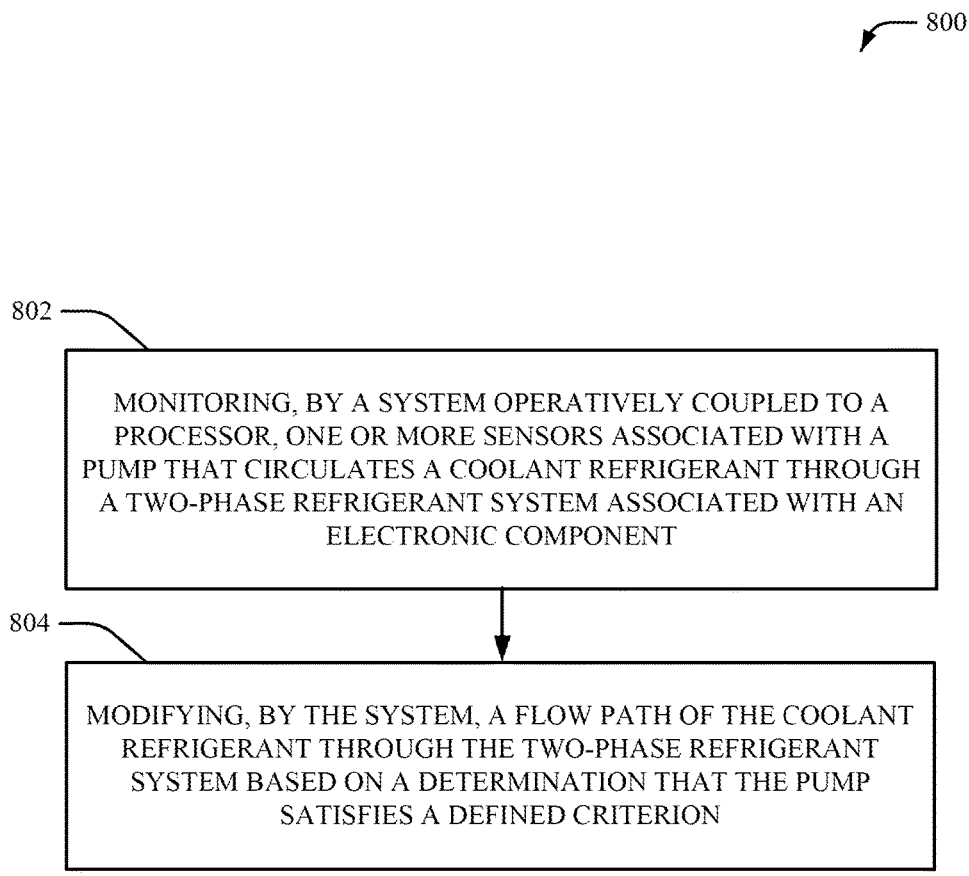
FIG. 8 illustrates a flow diagram of an example, non-limiting method that facilitates two-phase liquid cooling of one or more electronic components in an enclosure in accordance with one or more embodiments described herein.

FIG. 8 illustrates a flow diagram of an example, non-limiting method 800 that facilitates two-phase liquid cooling of one or more electronic components in an enclosure in accordance with one or more embodiments described herein. Repetitive description of like elements employed in other embodiments described herein is omitted for sake of brevity.

At 802, one or more sensors associated with a pump that circulates a coolant refrigerant through a two-phase refrigerant system associated with an electronic component is monitored by a system (e.g., by controller 302) operatively coupled to a processor. In an embodiment, a temperature associated with the pump can be monitored. Additionally or alternatively, a flow rate associated with the pump can be monitored. Additionally or alternatively, a pressure associated with the pump can be monitored. Additionally or alternatively, a power level associated with the pump can be monitored. At 804, a flow path of the coolant refrigerant through the two-phase refrigerant system is modified (e.g., by controller 302) based on a determination that the pump satisfies a defined criterion. For instance, the flow path of the coolant refrigerant through the two-phase refrigerant system can be modified based on a determination that the pump is not operational (e.g., that the pump is turned off or is not operating according to a design specification for the pump). In an embodiment, a state of a first valve (e.g., valve 202) and/or a second valve (e.g., valve 204) associated with the pump can be modified to facilitate modification of the flow path of the coolant refrigerant. In an embodiment, the modifying the flow path can comprise regulating a flow rate of the coolant refrigerant through the pump based on the determination that the pump satisfies the defined criterion. In certain embodiments, the method 800 can further comprise transmitting, a notification to an electronic device in communication with the system based on the determination that the pump satisfies the defined criterion. For instance, the electronic device can be a device that comprises a display such as, for example, a computing device, a computer, a desktop computer, a laptop computer, a monitor device, a smart device, a smart phone, a mobile device, a handheld device, a tablet, a wearable device, a portable computing device or another type of device associated with a display.

Figure 9:
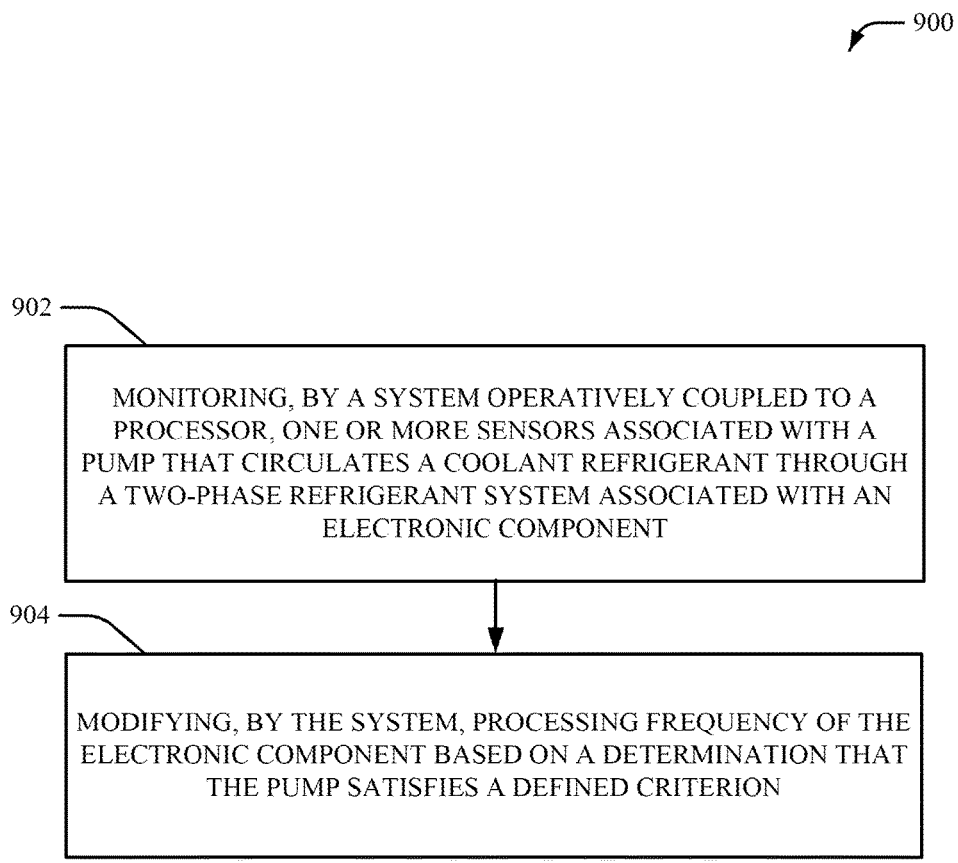
FIG. 9 illustrates a flow diagram of another example, non-limiting method that facilitates two-phase liquid cooling of one or more electronic components in an enclosure in accordance with one or more embodiments described herein.

FIG. 9 illustrates a flow diagram of an example, non-limiting method 900 that facilitates two-phase liquid cooling of one or more electronic components in an enclosure in accordance with one or more embodiments described herein. Repetitive description of like elements employed in other embodiments described herein is omitted for sake of brevity.

At 902, one or more sensors associated with a pump that circulates a coolant refrigerant through a two-phase refrigerant system associated with an electronic component is monitored by a system (e.g., by controller 302) operatively coupled to a processor. In an embodiment, a temperature associated with the pump can be monitored. Additionally or alternatively, a flow rate associated with the pump can be monitored. Additionally or alternatively, a pressure associated with the pump can be monitored. Additionally or alternatively, a power level associated with the pump can be monitored. At 904, a processing frequency of the electronic component is modified (e.g., by controller 302) based on a determination that the pump satisfies a defined criterion. For instance, the processing frequency of the electronic component can be modified based on a determination that the pump is not operational (e.g., that the pump is turned off or is not operating according to a design specification for the pump). In an embodiment, the processing frequency of the electronic component can be modified by performing dynamic frequency scaling associated with a processor throttling process. In certain embodiments, the method 900 can further comprise transmitting, a notification to an electronic device in communication with the system based on the determination that the pump satisfies the defined criterion. For instance, the electronic device can be a device that comprises a display such as, for example, a computing device, a computer, a desktop computer, a laptop computer, a monitor device, a smart device, a smart phone, a mobile device, a handheld device, a tablet, a wearable device, a portable computing device or another type of device associated with a display.

Figure 10:
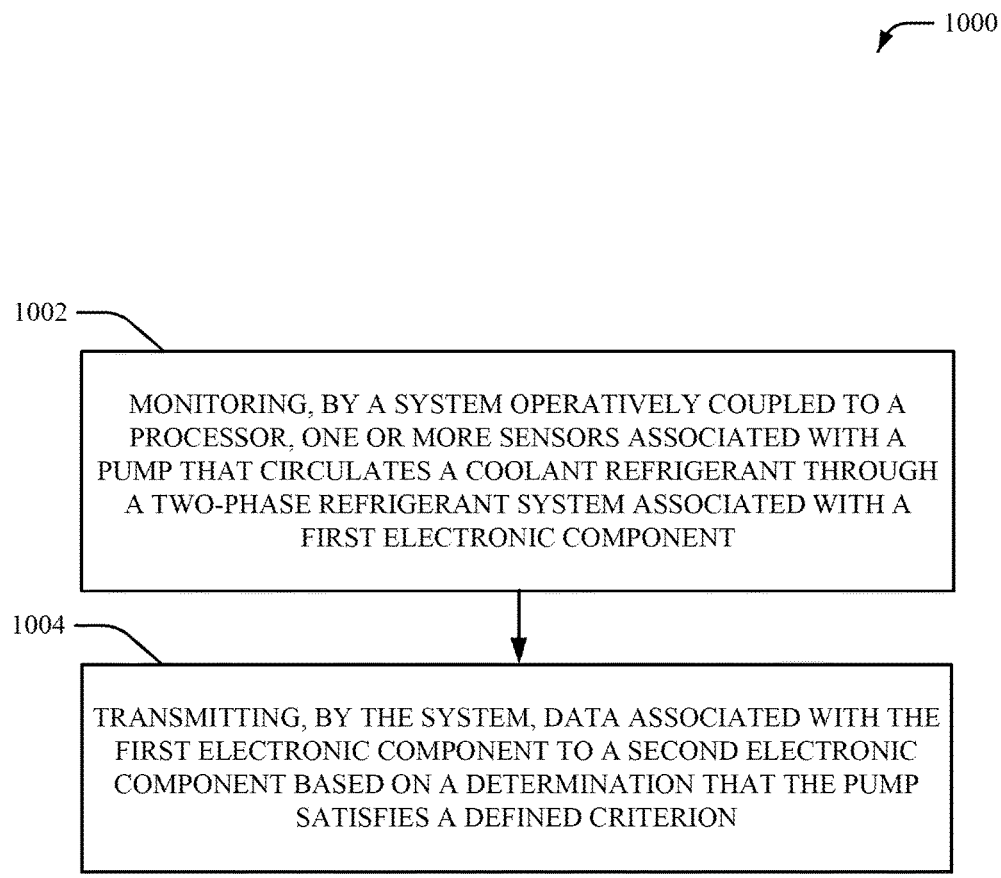
FIG. 10 illustrates a flow diagram of yet another example, non-limiting method that facilitates two-phase liquid cooling of one or more electronic components in an enclosure in accordance with one or more embodiments described herein.

FIG. 10 illustrates a flow diagram of an example, non-limiting method 1000 that facilitates two-phase liquid cooling of one or more electronic components in an enclosure in accordance with one or more embodiments described herein. Repetitive description of like elements employed in other embodiments described herein is omitted for sake of brevity.

At 1002, one or more sensors associated with a pump that circulates a coolant refrigerant through a two-phase refrigerant system associated with an electronic component is monitored by a system (e.g., by controller 302) operatively coupled to a processor. In an embodiment, a temperature associated with the pump can be monitored. Additionally or alternatively, a flow rate associated with the pump can be monitored. Additionally or alternatively, a pressure associated with the pump can be monitored. Additionally or alternatively, a power level associated with the pump can be monitored. At 1004, data associated with the first electronic component is transmitted (e.g., by controller 302) to a second electronic component based on a determination that the pump satisfies a defined criterion. For instance, data associated with the first electronic component can be transmitted to the second electronic component based on a determination that the pump is not operational (e.g., that the pump is turned off or is not operating according to a design specification for the pump). In one example, the first electronic component and the second electronic component can be located in the two-phase refrigerant system. Alternatively, the first electronic component can be located in the two-phase refrigerant system and the second electronic component can be located in another two-phase refrigerant system. In another example, the first electronic component and the second electronic component can be located in a corresponding enclosure. Alternatively, the first electronic component can be located in a first enclosure and the second electronic component can be located in a second enclosure. In certain embodiments, the method 1000 can further comprise transmitting, a notification to an electronic device in communication with the system based on the determination that the pump satisfies the defined criterion. For instance, the electronic device can be a device that comprises a display such as, for example, a computing device, a computer, a desktop computer, a laptop computer, a monitor device, a smart device, a smart phone, a mobile device, a handheld device, a tablet, a wearable device, a portable computing device or another type of device associated with a display.

For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies in accordance with the disclosed subject matter. In addition, those skilled in the art will understand and appreciate that the methodologies could alternatively be represented as a series of interrelated states via a state diagram or events. The flowchart and block diagrams in the Figures illustrate the architecture, functionality, and operation of possible implementations of systems, methods, apparatuses and devices according to various embodiments of the present invention. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

Figure 11:
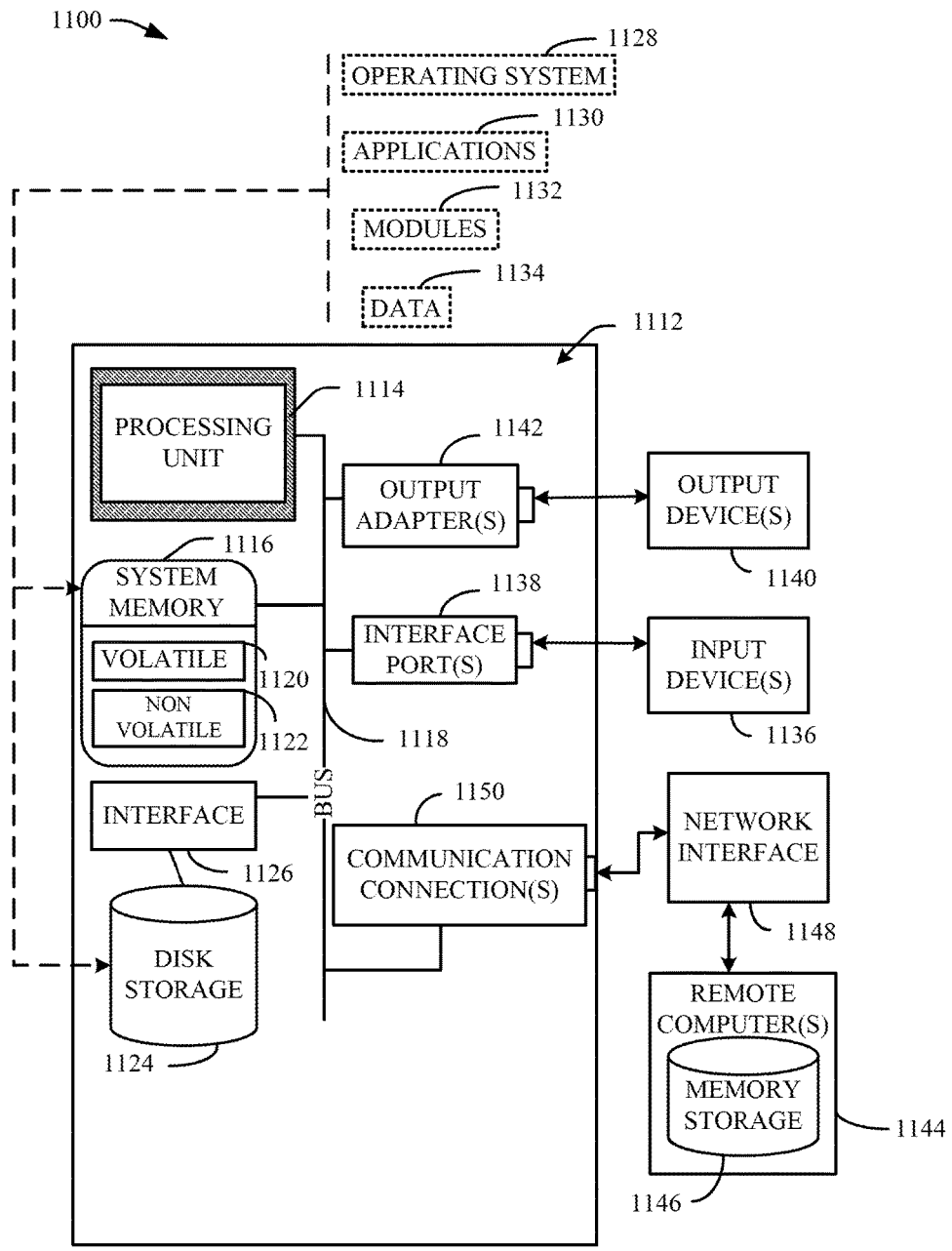
FIG. 11 illustrates a block diagram of an example, non-limiting operating environment in which one or more embodiments described herein can be facilitated.

In order to provide a context for the various aspects of the disclosed subject matter, FIG. 11 as well as the following discussion are intended to provide a general description of a suitable environment in which the various aspects of the disclosed subject matter can be implemented. FIG. 11 illustrates a block diagram of an example, non-limiting operating environment in which one or more embodiments described herein can be facilitated. Repetitive description of like elements employed in other embodiments described herein is omitted for sake of brevity.

With reference to FIG. 11, a suitable operating environment 1100 for implementing various aspects of this disclosure can also include a computer 1112. The computer 1112 can also include a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114. The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1116 can also include volatile memory 1120 and nonvolatile memory 1122. The basic input/output system (BIOS), containing the basic routines to transfer information between elements within the computer 1112, such as during start-up, is stored in nonvolatile memory 1122. Computer 1112 can also include removable/non-removable, volatile/non-volatile computer storage media. FIG. 11 illustrates, for example, a disk storage 1124. Disk storage 1124 can also include, but is not limited to, devices like a magnetic disk drive, floppy disk drive, tape drive, Jaz drive, Zip drive, LS-100 drive, flash memory card, or memory stick. The disk storage 1124 also can include storage media separately or in combination with other storage media. To facilitate connection of the disk storage 1124 to the system bus 1118, a removable or non-removable interface is typically used, such as interface 1126. FIG. 11 also depicts software that acts as an intermediary between users and the basic computer resources described in the suitable operating environment 1100. Such software can also include, for example, an operating system 1128. Operating system 1128, which can be stored on disk storage 1124, acts to control and allocate resources of the computer 1112.

System applications 1130 take advantage of the management of resources by operating system 1128 through program modules 1132 and program data 1134, e.g., stored either in system memory 1116 or on disk storage 1124. It is to be appreciated that this disclosure can be implemented with various operating systems or combinations of operating systems. A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port can be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a computer, a server, a router, a network PC, a workstation, a microprocessor based appliance, a peer device or other common network node and the like, and typically can also include many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1150 refers to the hardware/software employed to connect the network interface 1148 to the system bus 1118. While communication connection 1150 is shown for illustrative clarity inside computer 1112, it can also be external to computer 1112. The hardware/software for connection to the network interface 1148 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," "controller," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
a pump that circulates a coolant refrigerant through a two-phase refrigerant system associated with a first electronic component;
a valve that controls a flow path of the coolant refrigerant that flows through the two-phase refrigerant system, wherein the valve modifies the flow path of the coolant refrigerant through the two-phase refrigerant system in response to a determination that an operation of the pump satisfies a defined criterion; and
a controller that transfers, based on the determination that the operation of the pump satisfies the defined criterion, at least a portion of information associated with the first electronic component to a second electronic component.

2. The system of claim 1, wherein the controller modifies a processing state of the first electronic component based on the determination that the pump satisfies the defined criterion.

3. The system of claim 1, wherein the controller modifies the flow path based on sensor data provided by one or more sensors associated with the pump.

4. The system of claim 1, wherein the controller modifies the flow path based on sensor data provided by one or more sensors associated with a fan that provides air to the first electronic component.

5. The system of claim 1, wherein the determination is a first determination and the defined criterion is a first defined criterion, and wherein the controller reduces an amount of processing by the first electronic component based on a second determination that the pump satisfies a second defined criterion.

6. The system of claim 1, wherein the determination is a first determination and the defined criterion is a first defined criterion, and wherein the controller modifies a flow rate of the coolant refrigerant provided by the pump based on a second determination that the pump satisfies a second defined criterion.

7. The system of claim 1, further comprising a heat exchanger that transfers heat, from air in the system, to the two-phase refrigerant system.

8. The system of claim 1, further comprising a condenser to condense, to a liquid phase of the coolant refrigerant, a portion of the coolant refrigerant associated with a vapor phase of the coolant refrigerant.

9. The system of claim 1, wherein the two-phase refrigerant system associated with the first electronic component improves computational efficiency of the first electronic component.

10. A system, comprising:
an enclosure, comprising:
a two-phase cooling system that comprises a first electronic component and a pump that circulates a coolant refrigerant through the two-phase cooling system; and
one or more sensors that monitor the pump associated with the two-phase cooling system; and
a controller that is:
coupled to the one or more sensors;
regulates one or more control valves associated with the pump based on sensor data provided by the one or more sensors; and
transfers, based on a determination that operation of the pump satisfies a defined criterion, at least a portion of information associated with the first electronic component to a second electronic component.

11. The system of claim 10, wherein the controller modifies a flow rate of the coolant refrigerant through the pump based on the determination that the sensor data satisfies the defined criterion.

* * * * *